(12) United States Patent
Mueller et al.

(10) Patent No.: US 6,435,947 B2
(45) Date of Patent: Aug. 20, 2002

(54) CMP POLISHING PAD INCLUDING A SOLID CATALYST

(75) Inventors: Brian L. Mueller, Chandler, AZ (US); Shumin Wang, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 09/766,750

(22) Filed: Jan. 22, 2001

Related U.S. Application Data

(63) Continuation-in-part of application No. 09/084,630, filed on May 26, 1998, now Pat. No. 6,177,026.

(51) Int. Cl.$^7$ .................................................. B24B 1/00
(52) U.S. Cl. ........................................ 451/41; 451/526
(58) Field of Search ...................... 451/41, 526, 533, 451/539

(56) References Cited

U.S. PATENT DOCUMENTS

| | | |
|---|---|---|
| 3,668,131 A | 6/1972 | Banush et al. |
| 4,769,073 A | 9/1988 | Tastu et al. |
| 4,861,484 A | 8/1989 | Lichtin et al. |
| 4,929,257 A | 5/1990 | Miyazaki et al. |
| 4,959,113 A | 9/1990 | Roberts |
| 5,234,880 A | 8/1993 | Cook et al. |
| 5,264,010 A | 11/1993 | Brancaleoni et al. |
| 5,382,272 A | 1/1995 | Cook et al. |
| 5,439,551 A | 8/1995 | Meikle et al. |
| 5,527,423 A | 6/1996 | Neville et al. |
| 5,783,489 A | 7/1998 | Kaufman et al. |
| 5,785,868 A | 7/1998 | Li et al. |
| 5,804,513 A | 9/1998 | Sakatani |
| 5,866,031 A | 2/1999 | Carpio et al. |
| 5,948,697 A | 9/1999 | Hata |
| 5,954,997 A | 9/1999 | Kaufman et al. |
| 5,958,288 A | 9/1999 | Mueller et al. |
| 5,958,794 A | 9/1999 | Bruxvoort et al. |
| 5,980,775 A | 11/1999 | Grumbine et al. |
| 6,015,506 A | 1/2000 | Streinz et al. |
| 6,022,268 A * | 2/2000 | Roberts et al. ............. 451/548 |
| 6,068,787 A | 5/2000 | Grumbine et al. |

FOREIGN PATENT DOCUMENTS

| | | |
|---|---|---|
| EP | 0 811 666 | 12/1997 |
| EP | 0 826 756 | 3/1998 |
| EP | 0 831 136 | 3/1998 |

OTHER PUBLICATIONS

Analysis of Slurry MSW1000 manufactured by Rodel, Inc. (Oct. 27, 1995).

\* cited by examiner

Primary Examiner—Derris H. Banks
Assistant Examiner—David B. Thomas

(57) ABSTRACT

A polishing pad comprising a polishing pad substrate and at least one solid catalyst, the polishing pad being useful to remove metal layers from a substrate.

44 Claims, No Drawings

CM P POLISHING PAD INCLUDING A SOLID CATALYST

This application is a continuation-in-part of U.S. patent application Ser. No. 09/084,630, filed on May 26, 1998, now U.S. Pat. No. 6,177,026.

BACKGROUND OF THE INVENTION

1. Field of the Invention

This invention concerns a chemical mechanical polishing slurry including at least one oxidizer and a solid catalyst. The chemical mechanical polishing slurry is useful alone or in combination with other chemicals and abrasives for polishing metal layers and thin-films associated with semiconductor manufacturing. More particularly this invention concerns a chemical mechanical polishing slurry that is especially adapted for polishing multiple metal layers and thin-films where one of the layers or films is comprised of aluminum, copper, copper-aluminum alloy, and tungsten and another layer or thin film is comprised of titanium, tantalum or a titanium or tantalum containing alloy such as titanium nitride or tantalum nitride. This invention also concerns a method for using the polishing slurry that includes exposing the slurry to an energy source in order to activate the solid catalyst. This invention further concerns polishing pads including a polishing pad substrate and at least one solid catalyst as well as a method for polishing a metal feature with solid catalyst containing polishing pads.

2. Description of the Related Art

Integrated circuits are made up of millions of active devices formed in or on a silicon substrate. The active devices, which are initially isolated from one another, are united to form functional circuits and components. The devices are interconnected through the use of well-known multilevel interconnections. Interconnection structures normally have a first layer of metallization, an interconnection layer, a second level of metallization, and sometimes a third and subsequent levels of metallization. Interlevel dielectrics such as doped and undoped silicon dioxide ($SiO_2$), are used to electrically isolate the different levels of metallization in a silicon substrate or well. The electrical connections between different interconnection levels are made through the use of metallized vias. U.S. Pat. No. 4,789,648, which is incorporated herein by reference, describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to $SiO_2$. At the contact level, the adhesion layer acts as a diffusion barrier to prevent tungsten and $SiO_2$ from reacting.

In one semiconductor manufacturing process, metallized vias or contacts are formed by a blanket tungsten deposition followed by a chemical mechanical polish (CMP) step. In a typical process, via holes are etched through an interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess metal is removed by chemical mechanical polishing (CMP) to form metal vias. Processes for manufacturing and/or CMP of ILD's are disclosed in U.S. Pat. Nos. 4,671,851, 4,910,155 and 4,944,836.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is deposited onto the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed.

The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects, corrosion, and erosion. Furthermore, the polishing slurry may be used to provide controlled polishing selectivities to other thin-film materials used in current integrated circuit technology such as titanium, titanium nitride and the like.

Typically CMP polishing slurries contain an abrasive material, such as silica or alumina, suspended in an oxidizing, aqueous medium. For example, U.S. Pat. No. 5,244,534 to Yu et al. reports a slurry containing alumina, hydrogen peroxide, and either potassium or ammonium hydroxide that is useful to remove tungsten at predictable rates with little removal of the underlying insulating layer. U.S. Pat. No. 5,209,816 to Yu et al. discloses a slurry comprising perchloric acid, hydrogen peroxide and a solid abrasive material in an aqueous medium. U.S. Pat. No. 5,340,370 to Cadien and Feller discloses a tungsten polishing slurry comprising approximately 0.1M potassium ferricyanide, approximately 5 weight percent silica and potassium acetate. Acetic acid is added to buffer the pH at approximately 3.5.

Most of the currently available CMP slurries contain large concentrations of dissolved, ionic metallic components. As a result, the polished substrates can become contaminated by the adsorption of charged species into the interlayers. These species can migrate and change the electrical properties of the devices at gates and contacts and change the dielectric properties of the $SiO_2$ layers. These changes may reduce the reliability of the integrated circuits with time. Therefore, it is desirable to expose the wafer only to high purity chemicals with very low concentrations of mobile metallic ions.

Many well known, compositions will polish films such as copper at a low rate. In addition, the binder layers such as titanium and tantalum are very inert towards the chemistries. Because it can be difficult to polish these layers at a high rate, the polishing step must be lengthened to remove the last traces of the deposited metal. Lengthening the polishing step exposes layers, such as aluminum layers and $SiO_2$ layers, to overpolishing and to undesireable erosion. This erosion makes it more difficult to print high resolution lines during subsequent photolithography steps increasing the number of wafer failures. In addition, lengthened polishing steps reduce the throughput of an IC fabrication plant and increase the cost of the resulting IC.

Despite these advances, improvements to polishing compositions, polishing pads and polishing methods are still needed that will allow for the polishing of multiple metal layers such as aluminum and titanium, copper and tantalum, tungsten and titanium, and copper and titanium at high rates and in a single step.

SUMMARY OF THE INVENTION

The present invention is directed to chemical mechanical polishing composition that includes a heterogeneous solid metal oxide catalyst and an oxidizing agent.

The present invention is also directed to chemical mechanical polishing compositions in which the heterogeneous solid catalyst activity can be enhanced by activation with an energy source such as UV radiation.

In addition, this invention is a state-of-the art chemical mechanical polishing composition that is a "smart composition" because the heterogeneous solid catalyst can be selected to enhance the polishing of a specific metal or metal alloy by enhancing the catalytic activity of the heterogeneous solid catalyst using an energy source separated from the polishing composition and separated from the surface being polished.

Furthermore, this invention also includes methods for using the chemical polishing compositions of this invention to polish a plurality of metal layers in an integrated circuit in a controlled and efficient manner.

In one embodiment, this invention is an aqueous chemical mechanical polishing composition comprising at least one oxidizing agent and at least one solid catalyst.

In another embodiment, this invention is a chemical mechanical polishing slurry. The chemical mechanical polishing slurry comprises from about 0.1 to about 7.0 weight percent of an abrasive selected from silica, alumina, and mixtures thereof. The polishing slurry also includes at least one photoactivated solid catalyst, and an oxidizing agent selected from the group including monopersulfate, di-persulfate, peracetic acid, urea hydrogen peroxide, hydrogen peroxide, acids thereof, salts thereof, adducts thereof, or mixtures thereof wherein the solid catalyst is not silica and not alumina.

In still another embodiment, this invention is a method for polishing a substrate including at least one metal layer. The method comprises the steps of; (a) admixing at least one oxidizing agent, at least one solid catalyst, and deionized water to give an aqueous chemical mechanical polishing composition; (b) applying the chemical mechanical polishing composition to the substrate; and (c) removing at least a portion of the metal layer from the substrate by bringing a pad into contact with the substrate and moving the pad in relation to the substrate. The metal layers that can be removed from the substrate include, but are not limited to titanium, titanium nitride, tungsten, tantalum, tantalum nitride, aluminum and copper.

In yet another embodiment, this invention is a polishing pad including a polishing pad substrate and at least one heterogeneous solid catalyst.

In a further embodiment, this invention is a method for polishing a substrate surface including at least one metal portion. The method includes the steps of preparing a polishing pad by incorporating at least one heterogeneous solid catalyst into a polishing pad substrate. Once prepared, the polishing pad is then, in the presence of a solution including an oxidizing agent, brought into contact with the substrate surface after which at least a portion of the substrate surface metal portion is removed by moving the polishing pad in relation to the substrate.

DESCRIPTION OF THE CURRENT EMBODIMENT

The present invention relates to chemical mechanical polishing compositions and polishing pads that comprise at least one solid catalyst that controllably promotes a chemical reaction between an oxidizing agent and a substrate layer. The chemical mechanical polishing compositions and polishing pads are used to polish at least one layer associated with a substrate selected from the group including, but not limited to, silicon substrates, TFT-LCD glass substrates, GaAs substrates, and other substrates associated with integrated circuits, thin films, multiple level semiconductors, and wafers. In particular, the solid catalyst containing chemical mechanical polishing compositions and polishing pads of this invention have been found to exhibit excellent polishing performance when used to polish substrates including one or more layers of aluminum, copper, copper-aluminum alloy, tungsten, titanium, tantalum, titanium and tantalum containing alloys such as titanium nitride or tantalum nitride one or more nobel metals and combinations thereof in a single step, multiple metal layer chemical mechanical polishing process.

Before describing the details of the various preferred embodiments of this invention, some of the terms that are used herein will be defined. The "chemical mechanical composition" refers to the combination comprising of at least one oxidizing agent and at least one solid catalyst that may be used in conjunction with an abrasive pad to remove one or more layers of metal from a multiple layer metallization.

The term chemical mechanical polishing slurry, ("CMP slurry"), refers to a useful product of this invention that comprises the chemical mechanical composition of this invention and at least one abrasive. The CMP slurry is useful for polishing a multiple level metallization which may include but are not limited to semi-conductor thin-films, integrated circuit thin-films, and for polishing any other films, surfaces and substrates where CMP processes are useful.

The term "non-metallic" refers to compounds that are not at their zero oxidation state. For purposes of this invention, the term "non-metallic solid catalyst" refers to catalysts wherein at least 50 wt % and preferably at least 80 wt % of the catalyst is non-metallic.

One aspect of this invention is a chemical mechanical composition comprising an oxidizing agent and solid catalyst that is useful in oxidizing metal layers in polishing applications. This chemical mechanical composition is useful when incorporated in a chemical mechanical polishing slurry or when used in conjunction with an abrasive polishing pad to oxidize a metal layer to its corresponding oxide or ions. For example, the combination can be used to oxidize tungsten to tungsten oxide, aluminum to aluminum oxide and copper to copper oxide. The oxidizing agent—solid catalyst combinations disclosed herein are useful when incorporated into a CMP slurry or when used alone in conjunction with an abrasive pad to polish metals and metal based components including copper, aluminum, copper-aluminum alloy, tungsten, titanium, titanium nitride, tantalum, tantalum nitride and various mixtures and combinations thereof.

The chemical mechanical composition of this invention includes at least one oxidizing agent. The oxidizing agent is preferably an inorganic or organic per-compound. A per-compound as defined by *Hawley's Condensed Chemical Dictionary* is a compound containing at least one peroxy group (—O—O—) or a compound containing an element in its highest oxidation state. Examples of compounds containing at least one peroxy group include but are not limited to hydrogen peroxide, urea hydrogen peroxide, monopersulfates ($SO_5^-$), dipersulfates ($S_2O_8^-$), peracetic acid, percarbonates, organic peroxides such as benzoyl peroxide, and di-t-butyl peroxide. These oxidizers are useful in their listed form or in the form of their respective acid, salts, adducts, and mixtures thereof. Other, non-peroxy compounds which can be useful in compositions of this invention are periodic acid, periodiate salts, perbromic acid, perbromate salts, perchloric acid, perchloric salts, perboric acid, perborate salts, permanganates, and permanganate salts.

Monopersulfates are compounds which include the oxidizing $SO_5^-$ group as shown below.

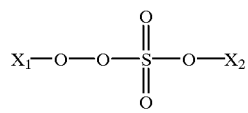

where $X_1$ and $X_2$ are each individually $H_1$, $Si(R')_3$, $—NH_3$, $N(R'')_3$ and alkali earth metals such as Li, Na, K, and so forth; where R' is an alkyl group having from 1 to 10 or more carbon atoms, and wherein R'' is H, an alkyl group, an aryl group, or mixtures thereof including, for example, $—Nme_3$, $Nbu_3$, $NPh_3$, $NmeBu_2$, $NHEt_2$ and so forth. One well known and preferred class of monopersulfates are combinations of $KHSO_5$, $KHSO_4$ and $K_2SO_4$. This combination is known as a triple salt. A most preferred monopersulfate oxidizing agent is ammonium persulfate.

Most preferred oxidizing agents are "per" compounds or a compound possessing a (—O—O—) reactive functional group such as monopersulftate, di-persulfate, peracetic acid, urea hydrogen peroxide, hydrogen peroxide, and acids, salts, adducts and mixtures thereof.

The oxidizing agent may be present in the overall chemical mechanical polishing slurry in an amount ranging from about 0.1 to about 20.0 weight percent. It is preferred that the oxidizer is present in the slurry in an amount ranging from about 0.2 to about 10.0 weight percent.

The chemical mechanical composition of this invention includes at least one heterogeneous solid catalyst. The purpose of the solid catalyst is to act as a catalyst and increase the kinetic rate of the oxidation reaction on the surface of a metal feature.

The term "heterogeneous solid catalyst" is used herein to refer to compositions in which the solid catalyst is distinct from the liquid phase and not significantly soluble (essentially insoluble) in the chemical mechanical composition liquid phase. In other words, the "active" insoluble solid catalyst can be mechanically or physically separated from the liquid phase. For example, the solid catalyst can be removed by a mechanical process such as centrifugation or filtration. This is distinct from a homogeneous catalyst system where the soluble catalyst exists in the liquid phase.

The heterogeneous solid catalyst can be a homogeneous composition of the active catalyst, or the active heterogeneous solid catalyst can be chemically or physically associated with the surface of the preferred abrasive as molecular species, as a small particle or as a monolayer. The solid catalysts are preferably small particles with high surface areas. The solid catalysts should have a mean particle diameter less than about 1 micron and a surface area greater that about 10 $m^2/g$ and less than about 250 $m^2/g$. It is more preferred that the solid catalysts have a mean particle diameter that is less than about 0.5 microns and most preferably less than about 0.25 microns.

The heterogeneous solid catalyst of this invention may also act as an abrasive when present in large enough amounts in the compositions of this invention. Since the useful catalytically active sites on the solid catalyst are restricted to the catalyst particle surface, the active catalyst will always be present even if portions of the abrasive surface is removed. This invention includes compositions and method for using a heterogeneous solid which has a catalytically active surface in any concentration up to 25 weight percent of the composition as both an abrasive and as a catalyst.

However, it is preferred that the solid catalyst is present in a small amount in the chemical mechanical compositions and slurries of this invention. The concentration of solid catalyst can be minimized in several ways. The pure abrasive particles can be physically dispersed or mixed with the solid catalyst. The abrasive can be a co-formed abrasive in which the solid catalyst is homogeneously mixed with another oxide to form solid particles containing an intimate mixture of the catalyst supported on metal oxide. In addition the solid catalyst can be supported on the abrasive particles. By "supported" we mean that the solid catalyst can be chemically or physically adsorbed on the surface of the abrasive as molecular species, small particles or as a monolayer.

The solid catalyst may be present in compositions of this invention in an amount of solid catalyst ranging from about 0.001 to about 25.0 weight percent. More preferably, the solid catalyst will be present in the compositions of this invention in an amount ranging from about 0.1 to about 10 wt %. When present in large amounts, greater than about 5.0 wt %, the solid catalyst may also have significant abrasive activity. It is preferred that the solid catalyst is present in a catalytic amount in the chemical mechanical compositions and slurries of this invention. By "catalytic amount" it is meant that the solid catalyst is present in an amount that is sufficient to promote the desired reaction without being consumed in the catalyzed process. Therefore, compositions of this invention may also include only a small amount, from about 0.005 to about 5.0 wt %, and more preferably from about 0.1 to about 3.0 wt % solid catalyst. It is also preferred that the solid catalyst is a composition other than the selected abrasive.

The solid catalyst of this invention is preferably an energy activated or photoactivated solid catalyst. By "photoactive" it is meant that the solid catalyst catalytic activity is enhanced by bombarding the solid catalyst with photons of light or electromagnetic radiation. It is preferred that catalytic activity of a photoactive solid catalyst of this invention is enhanced by exposing the catalyst to a source that emits light at wavelengths in the UV range of from about 1 to about 800 nm. It is most preferred that the activity of the photoactive solid catalyst is enhanced by a UV light source having a wavelength of from 200–400 nm and most preferably a UV wavelength less than about 390 nm.

The wattage of the UV light used to activate the photoactive solid catalyst is also important. The UV light used should have a wattage greater than 1 $\mu w/cm^2$. More preferably, the UV light used should have a wattage greater than about 20,000 $\mu w/cm^2$.

UV light wavelength and wattage are useful parameters for controlling the activation of the photoactive solid catalysts. For example, the UV light wattage can be kept constant while the wavelength is varied in order to increase or decrease the photoactivation rate of the photoactive solid catalyst. It is more preferred, however, to keep the wavelength of the UV light used constant while varying the UV light wattage in order to increase or decrease photoactive solid catalyst activity.

Solid catalysts useful in the compositions of this invention include all solid materials where photoelectric stimulation causes electrons in the solid material to be excited to a conducting band. Non-limiting examples of useful solid catalysts are semiconducting solid oxides having the formula $M_xO_y$, wherein M is selected from Ti, Ta, W, V, Nb, Mn, Zr. and mixtures thereof, where x and y are each the same or different numbers and wherein x and y are both greater than 0. Preferably, x and y are each individually greater than 0 and less than about 5.

Preferred photoactive solid catalysts are oxides of titanium including $TiO_2$, $Ti_2O_3$, and mixtures thereof. A most preferred photoacive solid catalyst is $Ti_2O_3$ because it is photoactivated with a greater efficiency than other more highly oxidized forms of titania The concentration ranges of solid catalyst in the chemical mechanical polishing slurry of this invention are generally reported as a weight percent of the entire compound. The use of high molecular weight metal containing compounds that comprise only a small percentage by weight of catalyst is well within the scope of catalysts in this invention.

As noted above, the solid catalysts useful in the compositions of this invention may be abrasive in nature. The solid catalysts may be present in compositions of this invention as discrete solid particles or they may be associated with the surface of metal oxide abrasive particles. For example, a titania photoactive solid catalyst can be chemically or physically absorbed on the surface of a silica abrasive particle or agglomerate and thereafter used in compositions of this invention.

The chemical mechanical composition of this invention may be combined with at least one abrasive to produce a CMP slurry. The abrasive is typically a metal oxide abrasive. The metal oxide abrasive may be selected from the group including alumina, titania, zirconia, germania, silica, ceria and mixtures thereof. The CMP slurry of this invention preferably includes from about 0.1 to about 20.0 weight percent or more of an abrasive. It is more preferred, however, that the CMP slurry of this invention includes from about 0.5 to about 7.0 weight percent abrasive.

The metal oxide abrasive may be produced by any techniques known to those skilled in the art. Metal oxide abrasives can be produced using any high temperature process such as sol-gel, hydrothermal or, plasma process, or by processes for manufacturing fumed or precipitated metal oxides. Preferably, the metal oxide is a fumed or precipitated abrasive and, more preferably it is a fumed abrasive such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable and often considered irreversible. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

A preferred metal oxide will have a surface area, as calculated from the method of S. Brunauer, P. H. Emmet, and I. Teller, J. Am. Chemical Society, Volume 60, Page 309 (1938) and commonly referred to as BET, ranging from about 5 $m^2/g$ to about 430 $m^2/g$ and preferably from about 30 $m^2/g$ to about 260 $m^2/g$. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

In this preferred embodiment, the metal oxide abrasive consists of metal oxide aggregates having a size distribution less than about 1.0 micron, a mean aggregate diameter less than about 0.4 micron and a force sufficient to repel and overcome the van der Waals forces between abrasive aggregates themselves. Such metal oxide abrasive has been found to be effective in minimizing or avoiding scratching, pit marks, divots and other surface imperfections during polishing. The aggregate size distribution in the present invention may be determined utilizing known techniques such as transmission electron microscopy (TEM). The mean aggregate diameter refers to the average equivalent spherical diameter when using TEM image analysis, i.e., based on the cross-sectional area of the aggregate. By force is meant that either the surface potential or the hydration force of the metal oxide aggregates must be sufficient to repel and overcome the van der Waals attractive forces between the aggregates.

In another preferred embodiment, the metal oxide abrasive may consist of discrete, individual metal oxide particles having a primary particle diameter less than 0.4 micron (400 nm) and a surface area ranging from about 10 $m^2/g$ to about 250 $m^2/g$.

It is preferred that the metal oxide abrasive is silica having a surface area of from about 120 $m^2/g$ to about 200 $m^2/g$.

Preferably, the metal oxide abrasive is incorporated into the aqueous medium of the polishing slurry as a concentrated aqueous dispersion of metal oxides, which concentrated aqueous dispersion of metal oxide abrasives typically ranges from about 3% to about 45% solids, and preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically completed by subjecting it to high shear mixing conditions known to those skilled in the art and optionally filtering the dispersion to remove unwanted impurities including large particles. The pH of the slurry may be adjusted away from the isoelectric point to maximize colloidal stability.

The chemical mechanical compositions and slurries of this invention may also include a film forming agent. The film forming agent may be any compound or mixtures of compounds that are capable of facilitating the formation of a passivation layer of metal oxides and dissolution inhibiting layers on the surface of the metal layer. Passivation of the substrate surface layer is important to prevent wet etching of the substrate surface. An example of useful film-forming agent is BTA, (benzotriazole).

Once a passivation layer has formed on the substrate surface it becomes useful to be able to disturb the passivation layer in order to abrade metal oxides from the substrate surface with abrasive components of CMP slurries of this invention. One class of compounds that is useful in disturbing the passivation layer is complexing agents. Useful complexing agents include but are not limited to acids such as inorganic acids, citric, lactic, tartaric, succinic, acetic, oxalic and other acids, as well as amino acid and amino sulfuric acids and their salts.

The complexing agents serve at least two useful functions in the CMP slurry of this invention. The complexing agent disturbs the passivation layer during the mechanical abrasion step without destroying the layer or inhibiting its formation during the abrasion step and especially after the abrasion step is complete. Secondly, the complexing agent is believed to form a complex with the oxidized metal and not the underlying unoxidized metal thereby limiting the depth of the oxidized layer. Complexing agents, if used in the compositions of this invention, should be present in the compositions in an amount ranging from about 0.5 to about 5.0 weight present.

The chemical mechanical composition of this invention may include at least one soluble catalyst. The purpose of the soluble catalyst is to transfer electrons from the metal being oxidized to the oxidizing agent (or analogously to transfer electrochemical current from the oxidizer to the metal). The soluble catalyst or soluble catalysts chosen may be metallic, non-metallic, or a combination thereof and the soluble catalyst must be able to shuffle electrons efficiently and rapidly between the oxidizer and metal substrate surface. Preferably, the soluble catalyst is chosen from soluble compounds including metal ions that have multiple oxidation states, such as but not limited to Ag, Co, Cr, Cu, Fe, Mo, Mn, Nb, Ni, Os, Pd, Ru, Sn, Ti and V. The term "multiple oxidation states" refers to an atom and/or compound that has a valence number that is capable of being augmented as the result of a loss of one or more negative charges in the form of electrons. Most preferred soluble metal catalysts are compounds of Ag, Cu and Fe and mixtures thereof. Especially preferred are soluble iron catalysts such as but not limited to inorganic salts of iron, such as iron (II or III) nitrate, iron (II or III) sulfate, iron (II or III) halides, including fluorides, chlorides, bromides, and iodides, as well as perchlorates, perbromates and periodates, and ferric organic iron (II or III) compounds such as but not limited to acetates, acetylacetonates, citrates, gluconates, malonates, oxalates, phthalates, and succinates, and mixtures thereof. The soluble catalyst may be present in the chemical mechanical polishing composition in an amount ranging from about 0.001 to about 2.0 weight percent. A most preferred soluble metal catalyst is ferric nitrate.

Other well known polishing slurry additives may be incorporated into the chemical mechanical polishing slurry of this invention. One class of optional additives are inorganic acids and/or salts thereof which may be added to the polishing slurry to further improve or enhance the polishing rate of the barrier layers in the wafer, such as titanium and tantalum. Useful inorganic additives include sulfuric acid, phosphoric acid, nitric acid, HF acid, ammonium fluoride, ammonium salts, potassium salts, sodium salts or other cationic salts of sulfates, phosphates and fluorides.

In order to promote stabilization of a CMP slurry of this invention against settling, flocculation, and decomposition, a variety of optional CMP slurry additives, such as surfactants, stabilizers, or dispersing agents, can be used. In general, the amount of additive such as a surfactant that may be used in the present invention should be sufficient to achieve effective stabilization of the slurry and will typically vary depending on the particular surfactant selected and the nature of the surface of the metal oxide abrasive. For example, if not enough of a selected surfactant is used, it will have little or no effect on CMP slurry stabilization. On the other hand, too much surfactant in the CMP slurry may result in undesirable foaming and/or flocculation in the slurry. Stabilizers such as surfactants should generally be present in the slurry of this invention in an amount ranging from about 0.001% to about 0.2% by weight, and preferably from about 0.001 to about 0.1 weight percent. Furthermore, the additive may be added directly to the slurry or treated onto the surface of the metal oxide abrasive utilizing known techniques. In either case, the amount of additive is adjusted to achieve the desired concentration in the polishing slurry. Preferred surfactants include dodecyl sulfate sodium salt, sodium lauryl sulfate, dodecyl sulfate ammonium salt, and mixtures thereof. Examples of useful surfactants include TRITON® DF-16 manufactured by Union Carbide, and SURFYNOL® manufactured by Air Products and Chemicals.

An additive which may be useful with this invention is one which stabilizes the oxidizer in the presence of the metal complex. It is well known that hydrogen peroxide is not stable in the presence of many metal ions without the use of stabilizers. For this reason, the CMP composition and slurries of this invention may include a stabilizer. Without the stabilizer, the catalyst and the oxidizing agent may react in a manner that degrades the oxidizing agent rapidly over time. The addition of a stabilizer to compositions of this invention reduces the effectiveness of the catalyst. Therefore the choice of the type and amount of stabilizer added to the composition is important and has a significant impact on CMP performance.

Useful stabilizers include phosphoric acid, organic acids (e.g., adipic, citric, malonic, orthophthalic, and EDTA), phosphonate compounds, nitriles and other ligands which bind to the metal and reduce its reactivity toward hydrogen peroxide decomposition and mixture thereof. The acid stabilizers may be used in their conjugate form, e.g., the carboxylate can be used instead of the carboxylic acid. For purposes of this application the term "acid" as it is used to describe useful stabilizers also means the conjugate base of the acid stabilizer. For example the term "adipic acid" means adipic acid and its conjugate base. Stabilizers can be used alone or in combination and significantly decrease the rate at which oxidizing agents such as hydrogen peroxide decomposes.

It is desirable to maintain the pH of the CMP slurry of this invention within a range of from about 2 to about 11, and preferably between from about 2 to about 8 in order to facilitate control of the CMP process. Slurry handling problems and substrate polishing quality problems are encountered when the pH of the CMP slurry of this invention is too low, e.g., less than 2. The pH of the CMP slurry of this invention may be adjusted using any known acid, base, or amine. However, the use of an acid or base that contains no metal ions, such as ammonium hydroxide and amines, or nitric, phosphoric, sulfuric, or organic acids is preferred to avoid introducing undesirable metal components into the CMP slurry of this invention.

The composition of this invention may be produced using any techniques known to those skilled in the art. In one method, the oxidizing agent and solid catalyst are mixed into an aqueous medium, such as deionized or distilled water, at pre-determined concentrations under low shear conditions until the oxidizer is completely dissolved and the solid catalyst is dispensed in the medium. A concentrated liquid dispersion of the metal oxide abrasive, such as fumed silica or alumina, is added to the chemical mechanical composition and diluted to the desired loading level of abrasive in the final CMP slurry. In addition, the solid catalyst and any additives such as one or more stabilizers, may be added to the slurry by any method that is able to incorporate solid catalyst compounds of this invention in an aqueous solution.

The compositions of the present invention may be supplied as one package system (at least one oxidizing agent, at least one solid catalyst, optional abrasive, and optional additives in a stable aqueous medium). To avoid possible composition degradation, however, it is preferred that at least a two package system is used where the first package comprises at least one oxidizing agent, and the second package comprises at least one solid catalyst. Optional components, such as an abrasive and any other optional additives may be placed in either the first container, the second container or in a third container. Furthermore, the components in the first container or second container may be in dry form while the components in the corresponding container are in the form of an aqueous dispersion.

A multi-package chemical mechanical composition or CMP slurry may be used with any standard polishing equipment appropriate for use on the desired metal layer of the wafer. The multi-package system includes one or more CMP components in aqueous or dry form in two or more containers. The multi-package system is used by combining the components from the various containers in the desired amounts to give CMP slurries comprising at least one oxidizing agent, at least one solid catalyst, and an optional abrasive in amounts described above.

Another aspect of this invention are catalyst containing polishing pads including a polishing pad substrate and at least one heterogeneous solid catalyst, preferably a non-metallic solid catalyst. The polishing pad substrate may be any type of polishing pad substrate that is useful for CMP. Typical polishing pad substrates available for polishing applications, such as CMP, are manufactured using both soft and/or rigid materials and may be divided into at least four groups: (1) polymer-impregnated fabrics; (2) microporous films; (3) cellular polymer foams and (4) porous sintered substrates. For example, a pad substrate containing a polyurethane resin impregnated into a polyester non-woven fabric is illustrative of the first group. Polishing pad substrates of the second group consist of microporous urethane films coated onto a base material which is often an impregnated fabric of the first group. These porous films are composed of a series of vertically oriented closed end cylindrical pores. Polishing pad substrates of the third group are closed cell polymer foams having a bulk porosity which is randomly and uniformly distributed in all three dimensions. Polishing pad substrates of the fourth group are open-celled, porous substrates having sintered particles of synthetic resin. Representative examples of polishing pad substrates useful, in the present invention, are described in U.S. Pat. Nos. 4,728,552, 4,841,680, 4,927,432, 4,954,141, 5,020,283, 5,197,999, 5,212,910, 5,297,364, 5,394,655, 5,489,233, and 6,062,968 each of the specifications of which are incorporated herein in their entirety by reference.

The polishing pad of this invention includes at least one non-metallic solid catalyst, as described above. The non-metallic solid catalyst should be present in the polishing pad in an amount ranging from 0.005–20.0 wt. %. Preferably, the non-metallic solid catalyst is present in the polishing pad in an amount ranging from about 1.0–10.0 wt. %.

Non-metallic solid catalysts may be incorporated into a polishing pad substrate by any method known in the art for incorporating a material into or onto a polymeric substrate. Examples of methods for incorporating the non-metallic solid catalysts into a polishing pad substrate include encapsulation, incorporation of time release catalyst particles into the polishing pad substrate, impregnation, creating a polymer/catalyst complex, incorporating the catalyst as a small molecule into the polishing pad substrate polymer matrix, or any combinations of these methods.

In one method for incorporating the catalyst into a polishing pad substrate, the catalyst maybe encapsulated within void spaces created during the manufacture of the pad substrate polymer matrix as an insoluble, semi-soluble or soluble material. Alternatively, the catalyst may be incorporated into the polymer precursor before it is polymerized into a matrix thereby allowing the pad substrate polymer to integrate and secure the catalyst in the polymer matrix.

In another alternative, the catalyst can be incorporated into a pad substrate after the pad substrate has been manufactured. One method for incorporating the catalyst into a premanufactured pad substrate is by impregnating the pad with a catalyst using conventional impregnation techniques. Impregnation can be accomplished by preparing a catalyst solution and applying the catalyst solution to the polishing pad and thereafter drying the polishing pad. One advantage of the impregnation technique is that the pads can be reimpregnated with catalyst once the catalyst in the catalyst containing polishing pad has been depleted to the point where it is no longer effective. This way, the polishing pad can be reused until the polishing pad substrate fails.

Catalyst containing polishing pads of this invention are used to planarize metal, semicontuctor or insulator layers during the manufacture of integrated circuits. The catalyst containing polishing pads are associated with a polishing machine and then brought into contact with the surface being polished. Typically, an aqueous polishing solution or composition comprising an oxidizing agent will be applied to the pad or directly to the metal layer where its reaction with the metal surface is catalyzed by the catalyst in the catalyst containing polishing pad. As mentioned above, an abrasive may optionally be incorporated into the oxidizing agent solution or an abrasive may be incorporated into the catalyst containing polishing pad. In addition, other polishing composition additives such as film forming agents, complexing agents, corrosion inhibitors, surfactants and the like may be incorporated into the polishing composition. Once the aqueous polishing composition is directed to the interface between the polishing pad and the substrate being polished, the catalyst containing polishing pad is moved in relationship to the substrate layer to planarize the substrate layer. When the planarization is complete the catalyst containing polishing pad is removed from contact with the substrate surface.

The solid catalysts used in the polishing pads and polishing compositions of this invention are generally most effective when used in chemical mechanical polishing processes. However, it has been determined that the preferred photoactive solid catalysts exhibit improved metal polishing properties and specifically improved titanium polishing rates when the solid catalyst used is photoactive. The photoactive solid catalysts typically are activated by light energy in the UV wavelength (from about 1–800 nm) at a wattage greater than 1 $\mu w/cm^2$ which causes the photoactive solid catalyst to be excited to a conducting band of the selected photoactive solid catalyst. This reaction will create more reactive sites on the surface on the catalyst to facilitate the formation of activated oxidizing species on surface on in solution.

When using the preferred photoactive solid titania catalysts, the UV light used to excite the solid catalyst emits in a wavelength from about 200–400 nm at a wattage greater than about 20,000 μw/cm². An Example of useful UV light source is an UVP high intensity long wave lamp manufactured by Black-Ray having a wattage of 27,100 μw/cm². The wavelengths useful for activating the preferred energy activated solid catalysts lie within the range of the wavelength of light emitted by ultraviolet light sources. Therefore, when the preferred energy activated solid catalyst are used in compositions of this invention, they may be activated with an ultraviolet light source. The photoreaction of the photoactivated catalyst is essentially instantaneous. When on, UV light will enhance the activity of the photoactivated catalyst and when the UV light is off, the catalyst will return quickly to its previous level of reactivity. It is preferred that the UV light is on continuously when enhanced catalyst activity is desired. In addition, the level of "enhancement" catalyst activity is influenced by the intensity or power output which is typically measured in watts. The UV light wattage can be adjusted to control the level of catalyst activity enhancement desired at the preferred wavelengths. Changing the UV light wavelength will also influence the efficiency of the catalyst photoactivation.

The ability to activate the photoactive solid catalyst containing compositions of this invention allows the compositions and polishing pads of this invention to be used to polish substrates including multiple layers or portions of metallization. For example, polishing compositions and polishing pads including photoactivated solid catalyst of this invention are useful for polishing substrates including both titanium and aluminum metal portions. The photoactive solid catalyst containing composition is applied to a substrate in order to polish the aluminum portion prior to activating the photoactivated solid catalyst. Prior to activation, the polishing compositions of this invention exhibit a high aluminum polishing rate. Once the polishing of the aluminum substrate portion is complete, the preferred photoactivated solid catalysts are activated with an ultraviolet light source and the titanium layer is polished. Upon activation, the preferred catalysts activates to help convert the oxidizing agent into activated form. This activated form of the oxidizing agent may be peroxy-type complexes on the surface of the solid catalyst or it may be hydroxy radicals in solution. What form the activated oxidizing agent takes is not well understood. However, what is known is that the activated oxidizing agent species are more aggressive towards certain metal layers such as titanium which improves titanium polishing rates.

When the preferred photoactivated non-metallic solid catalyst is incorporated into a polishing pad, the catalyst containing polishing pad may be activated with UV light before, and/or during and/or after polishing a semiconductor substrate with the polishing pad. The catalyst containing polishing pad of this invention may be activated with UV light intermittently, or continuously. Furthermore, the photoactivated non-metallic solid catalyst may also be useful in pad reconditioning. Pad reconditioning becomes necessary after multiple polishing pad uses. Reconditioning is typically a mechanical procedure in which the surface of the polishing pad is roughened to restore polishing pad polishing efficiency. The polishing pads of this invention can be reconditioned by exposing the catalyst containing polishing pads to UV light for a period of time sufficient to allow the catalyst to alter the surface characteristics of the polishing pad in order to improve the polishing pad polishing efficiencey. Catalysts useful for reconditioning the polishing pad surface not limited to non-metallic solid catalyst but may be any photoactivated solid catalyst that can be incorporated into the polishing pad polymer matrix.

EXAMPLES

We have discovered that compositions including an oxidizing agent and photoactivated solid catalysts are capable of polishing a multiple metal layers comprising, for example, aluminum and titanium at high rates while exhibiting an acceptable low polishing rate towards the dielectric layer.

The following examples illustrate preferred embodiments of this invention as well as preferred methods for using compositions of this invention.

Example 1

The ratio of the removal rate of Al to Ti (barrier) in a substrate including Ti and Al is preferably at most 2.5 with 1 being the ideal. Ammonium persulfate is an efficient oxidizer for Al, yet is not effective towards Ti. On the other hand, hydrogen peroxide is effective oxidizer for Ti, yet it passivates Al too effectively. This example demonstrates that a $TiO_2$ photoactive solid catalyst catalyzes the formation of activated species in a peroxy containing polishing composition. The addition of $Ti_2O_3$ enhances the catalytic effect, while maximum catalytic efficiency is obtained with UV radiation. The level of reaction or the amount of radical generated are reflected by the enhancement of Ti removal rate and the reduction of Al removal rate.

The slurries tested were aqueous slurries including 5 wt % of a fumed alumina abrasive from SEMI-SPERSE® W-A355 dispersion sold by the Cabot Microelectronics Corp., 4% ammonium persulfate, and 3% succinic acid all in an aqueous dispersion. The slurry pH was adjusted to about 3.5 using ammonium hydroxide. Varying amounts of $TiO_2$ and $Ti_2O_3$ solid catalysts were added to the slurry as set forth in Table 1. The slurries were then used to polish titanium or aluminum wafers either while being exposed to UV radiation or in the absence UV radiation. The polishing data reported in Table 1 is the result of polishing aluminum or titanium wafers on a Struers Tabletop Polisher with 5.3 psi down force, 150 rpm table speed, 100 rpm carrier speed and a Thomas West 724 pad. The UV lamp used was a UVP high intensity long wave lamp by Black-Ray, Model B100AP which emits UV light at a wattage of 21,7000 μw/CM². The UV light was applied to the pad continuously during polishing.

TABLE 1

| $Al_2O_3$ | $TiO_2$ | $Ti_2O_3$ | Substrate | UV radiation | rate Å/min |
|---|---|---|---|---|---|
| 5% | 0 | 0 | Ti | No | 206 |
| 3.75% | 1.25% | 0.1% | Ti | No | 532 |
| 3.75% | 1.25% | 1% | Ti | No | 918 |
| 3.75% | 1.25% | 1% | Ti | yes | 1691 |
| 3.75% | 1.25% | 0.1% | Al | no | 1892 |
| 3.75% | 1.25% | 0.1% | Al | yes | 1293 |

The titanium polishing rate was enhanced by the addition of titania catalyst to the slurry without photoactivation as demonstrated by comparing row 3 to 4 and row 5 to 6. The titanium polishing rate was also enhanced and the aluminum polishing rate was inhibited by activating the titania catalyst with ultraviolet radiation.

Example 2

This Example demonstrated the impact on W and Ti removal rates of adding $Ti_2O_3$, $TiO_2$ catalysts to polishing slurries and polishing with and without UV radiation. The basic polishing composition included 5% Oxone, an oxidizing agent manufactured by DuPont, and 0.2% $Fe(NO_3)_3$ 9 $H_2O$. CAB-O-SPERSE® SC-E fumed silica polishing slurry manufactured by Cabot Microelectronics Corp. (diluted to the desired silica loading level with deionized water) and varying amounts of $TiO_2$ and $Ti_2O_3$ were added to the basic polishing composition to achieve the weight percent amounts set forth in Table 2, below. Each composition tested was adjusted to a pH of from 2.0–2.3 with ammonium hydroxide.

Polishing was performed on an IPEC 472 polishing machine using a Suba 500 pad manufactured by Rodell at a 5 psi down force, 60 rpm table speed, 65 spindle speed. The UV light used was the same light described in Example 1 and it was applied to the pad continuously during polishing.

TABLE 2

| $SiO_2$ | $TiO_2$ | $Ti_2O_3$ | UV radiation | W removal Å/min | Ti removal Å/min |
|---|---|---|---|---|---|
| 5% | 0 | 0 | No | 3450 | 365 |
| 4% | 1% | 0 | No | 3297 | 1204 |
| 4% | 1% | 0 | Yes | 3397 | 1294 |
| 4% | 1% | 0.1% | Yes | 3426 | 1821 |

According to the polishing results reported in Table 2, the Ti removal rate was significantly enhanced when the slurry included $TiO_2$ and even more so with the addition of $Ti_2O_3$ under UV radiation. The presence of photoactivated titania ($Ti_2O_3$) will enhance the titanium rates.

Example 3

In metal CMP, plug or line erosion (due to wet etch or prolonged polishing) is undesirable. This Example evaluates the effect of a $TiO_2$ solid catalyst on plug erosion. The basic polishing composition used included 5% Oxone, 0.2% $Fe(NO_3)_3.9H_2O$.

The basic polishing composition was combined with CAB-O-SPERSE® SC-E fumed silica polishing slurry manufactured by Cabot Microelectronics Corp. (diluted to the desired silica loading level with deionized water) and $TiO_2$ in the amounts set forth in Table 3 below. The composition pH's were adjusted to from 2.0–2.3 with ammonium hydroxide. The polishing was preformed as described in Example 2. Erosion was measured using a Tencor P20 profilometer which measures how far past planer the film was polished in these areas.

TABLE 3

| $SiO_2$ | $TiO_2$ | W rate Å/min | dense plug erosion Å | sparse plug erosion Å |
|---|---|---|---|---|
| 5% | 0 | 3802 | 2558 | 978 |
| 4% | 1% | 3828 | 1073 | 320 |

The results show that the erosion can be reduced by enhancing the barrier film (Ti) removal rate, due to the shortened time to clear a wafer with a photoactivated catalyst.

What we claim is:

1. A polishing pad including:
a polishing pad substrate; and
at least heterogeneous solid catalyst.

2. The polishing pad of claim 1 wherein the heterogeneous solid catalyst is non-metallic.

3. The polishing pad of claim 2 wherein the non-metallic solid catalyst is a photoactivated catalyst.

4. The polishing pad of claim 2 wherein the non-metallic solid catalyst has the formula $M_xO_y$ wherein M is Ti, Ta, W, V, Nb, Zr, and mixtures thereof wherein x and y are each individually a number greater than 0.

5. The polishing pad of claim 4 wherein the non-metallic solid catalyst is $Ti_xO_y$.

6. The polishing pad of claim 4 wherein the non-metallic solid catalyst is selected from the group consisting of $TiO_2$, $Ti_2O_3$, and mixtures thereof.

7. The polishing pad of claim 2 wherein the non-metallic solid catalyst is present in the polishing pad in an amount ranging from about 0.005 to about 20.0 wt %.

8. The polishing pad of claim 2 wherein the non-metallic solid catalyst is a mixture of $TiO_2$ and $Ti_2O_3$ and is present in the polishing pad in an amount ranging from about 1.0 to about 10.0 wt %.

9. The polishing pad of claim 2 wherein the non-metallic solid catalyst has a mean particle diameter less than about 1 micron.

10. A polishing pad including;
a polishing pad substrate; and
from about 0.005 to about 20.0 wt % of a photoactivated non-metallic solid catalyst selected from the group consisting of $TiO_2$, $Ti_2O_3$, and mixtures thereof.

11. The polishing pad of claim 10 further including at least one abrasive.

12. The polishing pad of claim 11 wherein the photoactivated non-metallic solid catalyst is supported on the abrasive.

13. The polishing pad of claim 11 wherein the abrasive is at least one metal oxide abrasive selected from the group including alumina, ceria, germania, silica, titania, zirconia, and mixtures thereof wherein the abrasive is not the same compound as the photo-activated solid catalyst.

14. The polishing pad of claim 13 wherein the metal oxide abrasive is selected from the group consisting of silica, alumina, and mixtures thereof and wherein the metal oxide abrasive is present in the polishing pad in an amount ranging from about 0.1 to about 20.0 weight percent.

15. A method for polishing a substrate surface including at least one metal portion comprising the steps of:
(a) preparing a polishing pad by incorporating at least one non-metallic solid catalyst into a polishing pad substrate;
(b) applying a solution including an oxidizing agent to the polishing pad, to the substrate surface or both;
(c) bringing the polishing pad into contact with the substrate surface; and
(d) removing at least a portion of the metal portion from the substrate surface by moving the polishing pad in relation to the substrate.

16. The method of claim 15 wherein the non-metallic solid catalyst is a photo-activated catalyst.

17. The method of claim 15 wherein the non-metallic solid catalyst has the formula $M_xO_y$ wherein M is Ti, Ta, W, V, Nb, and mixtures thereof wherein x and y are each individually a number greater than 0.

18. The method of claim 15 wherein the non-metallic solid catalyst is $Ti_xO_y$.

19. The method of claim 15 wherein the non-metallic solid catalyst is selected from the group consisting of $TiO_2$, $Ti_2O_3$, and mixtures thereof.

20. The method of claim 15 wherein the non-metallic solid catalyst is present in the polishing pad in an amount ranging from about 0.005 to about 20.0 wt %.

21. The method of claim 15 wherein the non-metallic solid catalyst is a mixture of $TiO_2$ and $Ti_2O_3$ and wherein the catalyst is present in the pad in an amount ranging from about 1.0 to about 10.0 wt %.

22. The method of claim 15 wherein the non-metallic solid catalyst has a mean particle diameter less than about 1 micron.

23. The method of claim 16 wherein the polishing pad is exposed to light in the UV range.

24. The method of claim 16 wherein the polishing pad is exposed to light in the UV range prior to removal step (d).

25. The method of claim 16 wherein the polishing pad is exposed to light in the UV range during removal step (d).

26. The method of claim 16 wherein the polishing pad is exposed to light in the UV range following removal step (d).

27. The method of claim 23 wherein the UV light has a wavelength of from about 1 to about 800 nm.

28. The method of claim 23 wherein the UV light has a wavelength of from about 200 to about 400 nm.

29. The method of claim 23 wherein the UV light has a wattage of at least 1 $\mu w/cm^2$.

30. The method of claim 23 wherein the UV light has a wattage of at least 20,000 $\mu w/cm^2$.

31. The method of claim 23 wherein the wavelength of the UV light is held constant and the wattage of the light is varied to activate the solid catalyst.

32. The method of claim 23 wherein the wattage of the UV light is held constant and the wavelength is varied to activate the solid catalyst.

33. The method of claim 15 wherein the substrate metal portion is at least one metal selected from the group consisting of titanium, titanium nitride, tungsten, tantalum, tantalum nitride, aluminum, copper, nobel metals, alloys thereof and combinations thereof.

34. The method of claim 33 wherein the substrate surface includes a titanium containing metal portion wherein at least a portion of the titanium is removed in step (d).

35. The method of claim 33 wherein the substrate surface includes an aluminum containing metal portion wherein at least a portion of the aluminum is removed in step (d).

36. The method of claim 33 wherein the substrate surface includes a copper containing metal portion wherein at least a portion of the copper is removed in step (d).

37. The method of claim 33 wherein the substrate surface includes a portion selected from a tantalum portion, a tantalum nitride portion and combinations thereof.

38. The method of claim 15 wherein the solid catalyst acts as an abrasive and as a catalyst.

39. The method of claim 15 wherein the solution is applied to an interface between the polishing pad surface and the substrate surface being polished during removal step (d).

40. The method of claim 39 wherein the solution is water.

41. The method of claim 15 wherein the oxidizing agent is an organic per compound, an inorganic per compound, or mixtures thereof.

42. The method of claim 41 wherein the oxidizing agent is monopersulfate, di-persulfate, peracetic acid, urea hydrogen peroxide, hydrogen peroxide, acids thereof, salts thereof, adducts thereof, or mixtures thereof.

43. The method of claim 15 wherein the polishing pad includes at least one metal oxide abrasive selected from the group including alumina, ceria, germania, silica, titania, zirconia, and mixtures thereof.

44. The method of claim 15 wherein the polishing pad includes from about 0.2 to about 20.0 weight percent of an abrasive selected from silica, alumina or mixtures thereof.

* * * * *